(12) United States Patent
Sanchez et al.

(10) Patent No.: US 9,163,813 B2
(45) Date of Patent: Oct. 20, 2015

(54) LED LAMP WITH OPEN STRUCTURE

(71) Applicants: Fernando Roberto Sanchez, Mairinque (BR); Gilmar Aparecido de Souza, Sao Paulo (BR)

(72) Inventors: Fernando Roberto Sanchez, Mairinque (BR); Gilmar Aparecido de Souza, Sao Paulo (BR)

( * ) Notice: Subject to any disclaimer, the term of this patent is extended or adjusted under 35 U.S.C. 154(b) by 155 days.

(21) Appl. No.: 13/767,570

(22) Filed: Feb. 14, 2013

(65) Prior Publication Data

US 2013/0223080 A1    Aug. 29, 2013

(30) Foreign Application Priority Data

Feb. 16, 2012  (BR) .......................... 1020120034883

(51) Int. Cl.

| | |
|---|---|
| *F21V 3/00* | (2015.01) |
| *F21V 21/00* | (2006.01) |
| *F21K 99/00* | (2010.01) |
| *F21Y 101/02* | (2006.01) |
| *F21V 15/01* | (2006.01) |
| *F21V 23/00* | (2015.01) |
| *H05K 1/03* | (2006.01) |

(52) U.S. Cl.
CPC ................ *F21V 21/00* (2013.01); *F21K 9/135* (2013.01); *F21V 3/00* (2013.01); *F21V 15/01* (2013.01); *F21V 23/006* (2013.01); *F21Y 2101/02* (2013.01); *H05K 1/0306* (2013.01)

(58) Field of Classification Search
CPC ........................................................ F21V 1/00
USPC ..................................................... 362/311.02
See application file for complete search history.

(56) References Cited

U.S. PATENT DOCUMENTS

| | | | |
|---|---|---|---|
| 7,393,771 B2 * | 7/2008 | Hozoji et al. ................. 438/610 |
| 2010/0277067 A1 * | 11/2010 | Maxik et al. ..................... 315/32 |
| 2011/0037387 A1 * | 2/2011 | Chou et al. ....................... 315/35 |
| 2011/0049834 A1 * | 3/2011 | Natu ............................. 280/279 |
| 2011/0089838 A1 * | 4/2011 | Pickard et al. ................ 315/113 |
| 2013/0034996 A1 * | 2/2013 | Das et al. ................. 439/620.05 |

* cited by examiner

*Primary Examiner* — Anh Mai
*Assistant Examiner* — Hana Featherly
(74) *Attorney, Agent, or Firm* — Ware, Fressola, Maguire & Barber LLP

(57) ABSTRACT

A lamp (1) has one or more LED's (2), supported above an open structure (7). The lamp (1) is made from thermoplastic material and has a base (3) including threads (4) and a lower contact (5). A thermoplastic body (6) of larger diameter is located above the base and has an open structure portion (7) preferably shaped as a truncated inverted and open cone. An upper part of the cone supports a circuit board (8) with a laminar form that supports the light emitting diodes (2). A upper semispherical element (9) is located over the body (6) and forms a light diffuser. An upper center of the base (3) has an internal electronic circuit (10) for connecting to a power source. The LED lamp with the open structure eases installation, has lower weight and cost, allows easy recycling and provides greater security for users.

12 Claims, 1 Drawing Sheet

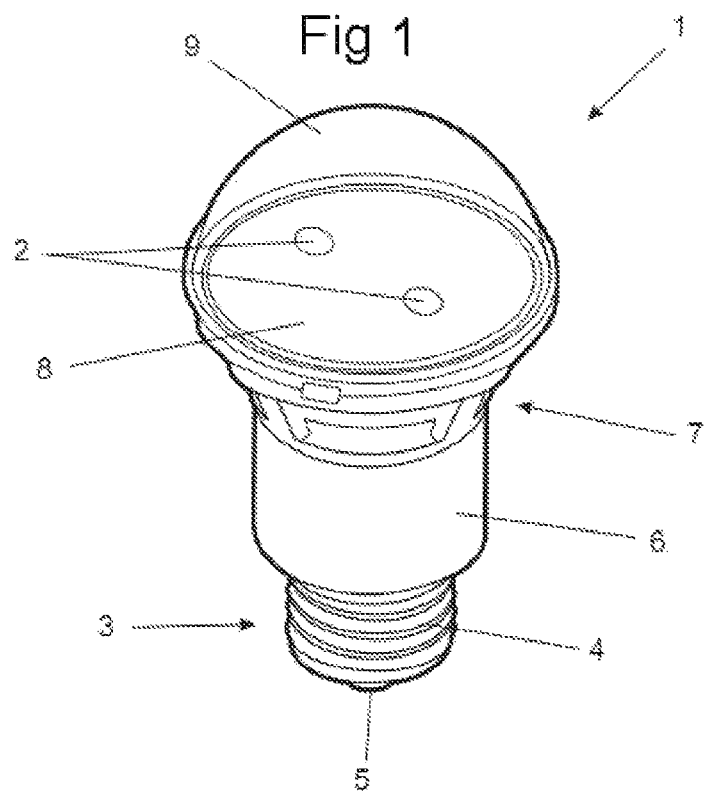
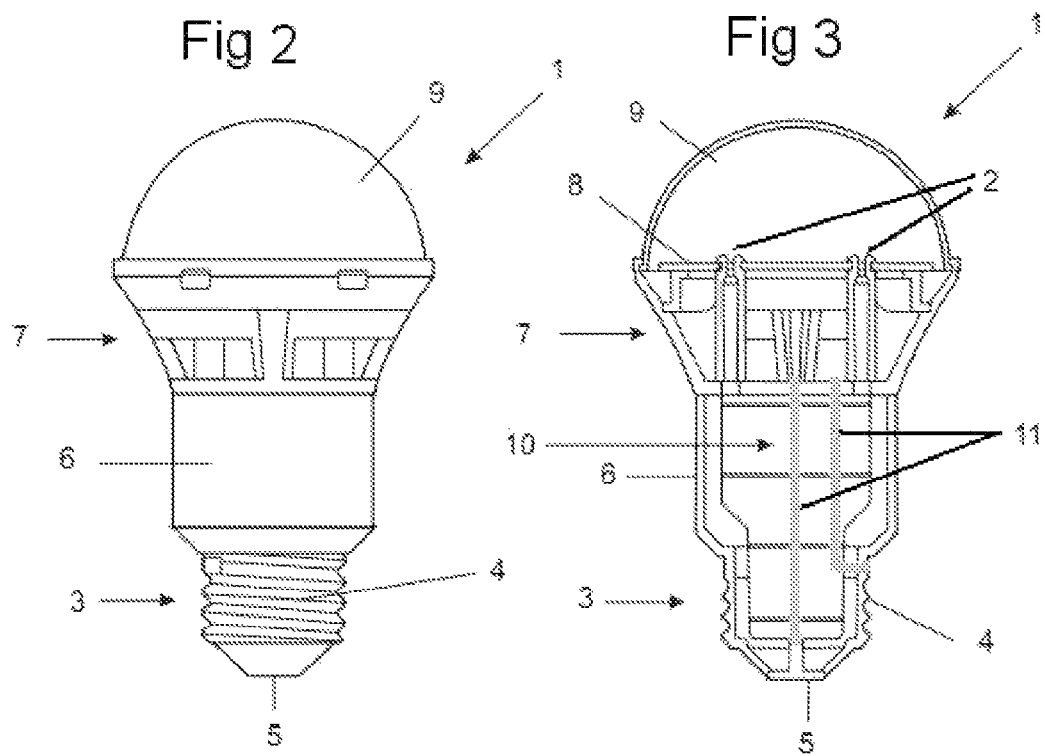

LED LAMP WITH OPEN STRUCTURE

TECHNICAL FIELD

The present invention relates to a new type of lamp remarkably developed with a lighting device using LEDs (light emitting diodes), its structure being open. The lamp belongs to the field of electroluminescent light sources and devices consisting of a plurality of semiconductors or other solid state components formed or not formed in or over a common substrate, including semiconductor components with at least one potential barrier or a surface barrier adapted for light emission. The lamp is designed to promote greater ease of installation, showing lower weight, lower manufacturing cost, allowing ease in recycling and providing greater security for users, in addition to the recognized advantages provided by LEDs, such as low energy consumption and high luminous efficiency.

BACKGROUND ART

As widely known by professionals involved in the industry and trade of equipment, devices and accessories of lighting, the filaments of incandescent lamps are usually made of tungsten, a metal that melts only when subjected to a very high temperature (3,422° C.).

To prevent that the filaments come into combustion and quickly burnout, all the air is removed from the bulb and the bulb is filled with a mixture of inert gases, nitrogen and argon or krypton.

Incandescent lamps operate at low pressures and emit light energy and a lot of heat by an infrared radiation component.

These lamps demand high consumption of electric energy and additionally they work at very high temperatures, which partly reflect on its outer body, and this type of lamp also has a very short lifetime (1,000 hours).

Fluorescent lamps, unlike filament lamps, have an improved efficiency as they emit higher electromagnetic energy in the form of light than heat (infrared), and they are more economical in addition to being cold.

Fluorescent lamps operate similarly to neon gas discharge tubes, having a pair of electrodes at each end. The glass tube is covered with a phosphorescent material that, when excited by ultraviolet radiation generated by ionization of the gases, produces visible light.

Fluorescent lamps are internally filled with inert gases at low pressure, and the most common ones use argon. Besides the phosphor coverage, there are filament-shaped electrodes at their ends and mercury. Its function is to preheat the inside of the glass tube to reduce the voltage required for ionization, starting the process of bombardment by positive ions of gas in the tube.

When the internal composition is based on mercury vapor, a voltage gradient of a few hundred volts needs to be applied while at the same time the ends are heated up. During the ionic discharge, and resulting emission of U.V. light that excites the phosphor wall of the glass tube, there is no need for the high voltage between the ends of the tube anymore, so the high voltage is reduced to less than 100 V in the case of low power lamps and up to 175 V in the case of high power lamps.

The voltage applied to the gas triggers the emission of large amounts of U.V. radiation in the wavelength of the mercury emission. This emission is converted into visible light by the phosphor layer which, depending on the mixture applied, defines the hue of the emitted color.

To be started, a fluorescent lamp needs two extra accessories, namely a starter, which is nothing more than a bi-stable thermal relay and a ballast, which is a coil that generates the high voltage required to start and control the current drawn by the lamp.

The starter works only at the ignition of the lamp, being off all the rest of the time, it can even be removed from the circuit and the lamp remains on.

The lighting implemented through LEDs or light emitting diodes was used at the beginning with a basic functionality, the lighting of locations and instruments where its use was more convenient than a traditional lamp.

Being increasingly used in microelectronic products as a flag for warnings, it can also be found with larger dimensions, as in some models of traffic lights. It is also widely used in LED panels, LED curtains and LED tracks, including household lamps.

Nowadays LED lamps are widely used in homes, offices, etc., being provided with greater luminescence, lower work temperatures and higher lifetime compared to other types of lamps of the consumer market.

Conventional LED lamps designed for home use have an adequate functionality and useful life, however they have in their composition and assembly an amount of aluminum mass which raises its own weight and increases the amount of material required for its production, thereby increasing its cost.

Another aspect that can be improved relates to the difficulty of recycling of the materials from which a conventional LED lamp is composed.

SUMMARY OF THE INVENTION

Thinking about the characteristics that define the LED lamps available on the consumer market and interested in providing improvements to this same market, the inventor, after extensive research, created and developed an LED lamp with an open structure, which should position itself with full advantage against its competitors and customize itself against the consumer market due to the fact that it consists of a lamp with a LED lighting device, specifically developed with an open structure, that promotes ease of installation, has lower weight and lower manufacturing costs, allows easy recycling and provides greater security to users.

The above mentioned lamp can be manufactured due its dissipation efficiency obtained by the use of a very thin nano-ceramic material for the coating of the aluminum as described in a patented invention described in a patent by the same applicant herewith, registered under Brazilian Patent numbers PI 1001638-4, "Process of manufacturing laminate to printed circuit boards, laminate to printed circuit boards obtained thereof and printed circuit mounting base" and PI 1103310-0, "High powered light emitting device" (corresponding to U.S. Pat. No. 8,506,113) also with their respective certificate of addition with the same name and number.

The above mentioned documents describe a ceramic coating on a metallic plate supporting the LEDs and their interconnection, which eliminates the need for the printed circuit board universally in use today for mounting the LEDs, with a thermal diffusivity that eliminates the use of finned heatsinks.

The LED lamp with an open structure discloses an electronic illumination device based on light emitting diodes, or LEDs, mounted on an open thermoplastic base, the light emitting diodes being protected by a colored and translucent semi-spherical element, called a light diffuser.

The LED lamp shows a general differentiated constructiveness, with an external projection similar to the standard formats of compact fluorescent lamps or conventional LED lamps, however, being composed basically of elements made of recyclable nonmetallic and also metallic materials.

The electronic illumination device proposed herein is more efficient and durable than conventional compact fluorescent lamps and reveals substantial direct and indirect functional improvements in comparison with other conventional illumination devices based on light emitting diodes and incandescent bulbs, such as substantially lower cost, lower weight, greater safety to the user, allows recycling at the end of its useful life and also reveals simplicity of industrial manufacturing and installation.

BRIEF DESCRIPTION OF THE DRAWINGS

The subject of this invention will become fully clear in its technical aspects from the detailed description that was made based on the figures listed below, in which:

FIG. 1 shows a perspective view of the LED lamp with an open structure;

FIG. 2 shows a front view of the LED lamp with an open structure; and

FIG. 3 shows a sectional front view of the LED lamp with an open structure.

DETAILED DESCRIPTION OF THE INVENTION

According to above mentioned figures, the present invention is a LED lamp with open structure, which refers more specifically to a lamp 1 provided with one or more lighting devices, LED's 2, being remarkably developed with an open structure and capable of promoting ease of installation, with lower weight, lower manufacturing cost, allowing easy recycling and providing greater security to users.

The LED lamp 1 with an open structure includes an electronic device based on light emitting diodes, or LED 2, mounted on an aluminum base with a nanoceramic coating of high thermal diffusivity, and protected by a translucent dome, called a light diffuser.

The LED lamp 1 has a general differentiated constructiveness with an external projection similar to the standard formats of fluorescent lamps or conventional LED lamps, however, being manufactured fundamentally of recyclable thermoplastic materials. The LED lamp 1 is basically composed of a cylindrical lower base 3 having a rewind threads 4, and having a lower contact 5, a thermoplastic cylindrical body 6 of larger diameter, and at its upper end, an open portion 7 preferably with the shape of a truncated inverted cone.

The upper part of the truncated inverted cone element 7 incorporates a circuit board 8 with a laminar form, connected with the light emitting diodes LEDs 2 positioned on the upper part, and a second upper semispherical element 9, called a light diffuser, which can be produced in different colors.

At the top center of the base 3 of the lamp 1 with the LED 2, there is incorporated an internal electronic circuit 10, said circuit being responsible for conducting the electrical signal from an external power source, through the use of ducts, pins or contact wires 11 and other such connectors, to provide an electrical signal suitable for use with the light emitting diodes.

The printed circuit boards of said open structure lamps are produced from a nanoceramic material, and may also be produced from other materials, as long as they have equivalent characteristics.

The common materials from which the printed circuit boards for the open structure lamps are manufactured are vulnerable, that is, if a printed circuit board of a lamp is made of other material that does not have the characteristics of the nanoceramic material, its functioning regarding the lighting will be similar, however, the useful life of said lamp is substantially smaller than of those built with this material, and still exhibits higher costs.

The electronic illumination device herein proposed is more efficient than conventional compact fluorescent lamps and presents substantial direct and indirect functional improvements compared to conventional lighting devices based on light emitting diodes, with substantially lower cost, lighter weight, higher safety to the user, while still allowing recycling at the end of its useful life and also allowing greater simplicity for industrial manufacturing and installation.

Despite the detailed description of the invention, it is important to understand that the same does not limit its application to the details and steps herein described. It is additionally capable of other embodiments and can be practiced or carried out in a variety of ways. It should be understood that the terminology employed herein has the purpose of description and not of limitation.

The invention claimed is:

1. A light emitting diode lamp consisting essentially of:
   one or more light emitting diodes;
   a base made from a thermoplastic material, provided with a lower contact;
   a thermoplastic body of larger diameter disposed above the base and having an extreme upper portion which has an open structure;
   a circuit board consisting of an aluminum base with a high thermal diffusivity coating and having a laminar form located in an upper part of said upper portion, above the open structure, the circuit board incorporating the one or more light emitting diodes mounted on the circuit board, the circuit board having a thermal diffusivity sufficient to eliminate use of a heatsink; and,
   an upper semispherical element forming a light diffuser disposed above the thermoplastic body, an upper center of the base having an internal electronic circuit connected to said lower contact for receiving power from an external power source, and for providing power to said light emitting diodes.

2. The light emitting diode lamp of claim 1 wherein the upper portion is in the shape of a truncated inverted and open cone.

3. The light emitting diode lamp of claim 1, wherein the base has a cylindrical form and includes an external thread.

4. The light emitting diode lamp of claim 1, wherein the thermoplastic body has a cylindrical shape.

5. The light emitting diode lamp of claim 1, wherein the thermoplastic body has a prismatic shape.

6. The light emitting diode lamp of claim 1, wherein the upper semispherical element is translucent.

7. The light emitting diode lamp of claim 1, wherein the upper semispherical element is manufactured in different colors.

8. The light emitting diode lamp of claim 1, wherein the thermoplastic material is a colored material.

9. The light emitting diode lamp of claim 1, wherein the thermoplastic body and thermoplastic base are made by thermoplastic processing methods.

10. The light emitting diode lamp of claim 1, wherein the open structure portion has a shape selected from the group consisting of cylindrical, prismatic, and other shapes suitable for use.

11. The light emitting diode lamp of claim 1, wherein the upper element has a form selected from the group consisting of elliptical, flat, and other forms suitable for use.

12. The light emitting diode lamp of claim 1 wherein the high diffusivity coating comprises a nanoceramic material.

\* \* \* \* \*